United States Patent
Lee et al.

(10) Patent No.: US 7,149,072 B2
(45) Date of Patent: Dec. 12, 2006

(54) MULTILAYERED CHIP CAPACITOR ARRAY

(75) Inventors: Byoung Hwa Lee, Kyungki-do (KR); Hiroki Sato, Kyungki-do (KR); Chang Hoon Shim, Kyungki-do (KR); Sang Soo Park, Kyungki-do (KR); Hae Suk Chung, Seoul (KR); Dong Seok Park, Seoul (KR); Min Cheol Park, Kyunki-do (KR); Hyun Ju Yi, Seoul (KR); Min Kyoung Kwon, Kyungki-do (TW); Seung Heon Han, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 11/264,486

(22) Filed: Nov. 1, 2005

(65) Prior Publication Data

US 2006/0092595 A1    May 4, 2006

(30) Foreign Application Priority Data

Nov. 4, 2004 (KR) ...................... 10-2004-0089314
Dec. 7, 2004 (KR) ...................... 10-2004-0102609

(51) Int. Cl.
*H01G 4/236* (2006.01)
*H01G 4/20* (2006.01)

(52) U.S. Cl. ...................... 361/307; 361/312
(58) Field of Classification Search .. 361/306.1–306.3, 361/307, 311–312
See application file for complete search history.

(56) References Cited

U.S. PATENT DOCUMENTS

| | | | |
|---|---|---|---|
| 5,880,925 A | 3/1999 | DuPré et al. | |
| 6,344,961 B1 | 2/2002 | Naito et al. | |
| 6,370,010 B1 * | 4/2002 | Kuroda et al. | 361/306.1 |
| 6,407,907 B1 * | 6/2002 | Ahiko et al. | 361/306.3 |
| 6,496,354 B1 * | 12/2002 | Naito et al. | 361/306.1 |
| 6,532,143 B1 | 3/2003 | Figueroa et al. | |
| 6,961,231 B1 * | 11/2005 | Alexander et al. | 361/321.2 |
| 2005/0007723 A1 * | 1/2005 | Mosley | 361/306.1 |

FOREIGN PATENT DOCUMENTS

| | | |
|---|---|---|
| KR | 10-2001-39561 | 5/2001 |
| KR | 10-2001-49257 | 6/2001 |

* cited by examiner

*Primary Examiner*—Eric W. Thomas
(74) *Attorney, Agent, or Firm*—Volpe and Koenig, PC

(57) ABSTRACT

Disclosed herein is a multilayered chip capacitor array, including a capacitor body having a plurality of dielectric layers, a plurality of pairs of first and second inner electrodes which are formed on the plurality of dielectric layers such that one electrode of one pair of inner electrodes faces the other electrode of the one pair of inner electrodes with one of the plurality of dielectric layers interposed therebetween, at least one first outer terminal and a plurality of second outer terminals formed on at least one surface of a top surface and a bottom surface of the capacitor body, and at least one first conductive via and a plurality of second conductive vias formed in a stacking direction of the capacitor body and connected to the first outer terminal and the second outer terminal, respectively.

15 Claims, 7 Drawing Sheets

(a)

(b)

(a)

(b)

(c)

(a)

(b)

MULTILAYERED CHIP CAPACITOR ARRAY

BACKGROUND OF THE INVENTION

1. Field of the Invention

The present invention relates generally to a multilayered chip capacitor, and, more particularly, to a multilayered chip capacitor in which a plurality of capacitors are provided in a single chip.

2. Description of the Related Art

As well known to those skilled in the art, a multilayered chip capacitor (MLCC) has a structure composed of inner electrodes interposed between a plurality of dielectric layers. The MLCC, which is advantageous because of a small size, a high capacity and easy mounting, is widely applied in various electronic devices.

Recently, to decrease the size of the part and realize an easy mounting process, there is required a multilayered chip capacitor array characterized in that two or more capacitors having the same or different electrostatic capacities are fabricated in a single chip.

FIGS. 1a and 1b are an exploded perspective view and a schematic perspective view, respectively, showing a conventional multilayered chip capacitor array.

As shown in the exploded perspective view of FIG. 1a, two first inner electrodes 12a and 12b and two second inner electrodes 13a and 13b are formed on a plurality of dielectric layers 11a and 11b, respectively. The first and second inner electrodes 12a, 12b, 13a and 13b have leads 14a, 14b, 15a and 15b extending from one lateral side thereof. The dielectric layers 11a and 11b having the first and second inner electrodes 12a, 12b, 13a and 13b shown in FIG. 1a are stacked together, to form a capacitor body 11 as shown in FIG. 1b. Further, as apparent from FIG. 1b, outer terminals 16a, 16b, 17a and 17b connected to the leads 14a, 14b, 15a and 15b are provided, thereby completing the multilayered chip capacitor 10.

As such, the first and second inner electrodes 12a and 13a at one side of the structure and the first and second inner electrodes 12b and 13b at the other side function as separate capacitors. The conventional multilayered chip capacitor array 10 depicted in FIGS. 1a and 1b includes capacitors arranged in a horizontal direction, and thus, it is difficult to decrease the size thereof when three or more capacitors are used.

In addition, the conventional multilayered chip capacitor array 10 is required to have lower equivalent series inductance (ESL), in order to be used particularly as a decoupling capacitor connected between a semiconductor chip and a power source in a power circuit of LSI.

To reduce the equivalent series inductance, U.S. Pat. No. 5,880,925 discloses a plurality of lead structures in an interdigitated arrangement of leads having opposite polarities. However, the above structure is unsuitable for use in the conventional multilayered chip capacitor arrays having a plurality of inner electrodes horizontally arranged. That is, in cases where the number of leads doubles on one lateral side of a single inner electrode in the multilayered chip capacitor array shown in FIG. 1a, it increases by two times of the number of capacitors. Thus, it is difficult to increase the number of leads in a limited space to obtain the desired ESL reduction effects.

Further, the conventional multilayered chip capacitor array is disadvantageous because the size thereof cannot decrease due to the structural restriction, and the limitation is imposed on changing the lead structure for ESL reduction.

SUMMARY OF THE INVENTION

Accordingly, the present invention has been made keeping in mind the above problems occurring in the prior art, and an object of the present invention is to provide a multilayered chip capacitor array, characterized in that a plurality of capacitors are provided using conductive vias formed in a stacking direction and outer terminals formed on a top surface or a bottom surface of a capacitor body, and the conductive vias are properly disposed, thereby realizing ESL reduction effects.

Another object of the invention is to provide a wiring connection structure for a multilayered chip capacitor array having an internal connection structure adequate for use with the foregoing multilayered chip capacitor array.

In order to accomplish the above object, the present invention provides a multilayered chip capacitor array, comprising a capacitor body having a plurality of dielectric layers stacked together, a plurality of pairs of first and second inner electrodes which are formed on the plurality of dielectric layers such that one electrode of one pair of inner electrodes faces the other electrode of the one pair of inner electrodes with one of the plurality of dielectric layers interposed there between, at least one first outer terminal and a plurality of second outer terminals formed on at least one surface of a top surface and a bottom surface of the capacitor body, and at least one first conductive via and a plurality of second conductive vias formed in a stacking direction of the capacitor body and connected to the first outer terminal and the second outer terminals, respectively, wherein the at least one first conductive via is connected to the first inner electrode and is electrically insulated from the second inner electrode, the plurality of the second conductive vias are divided into k (k≧2) groups each having at least one second conductive via, and the second inner electrodes are divided into k groups each having at least one second inner electrode, and each group of second conductive vias is connected to each group of second inner electrodes and is electrically insulated from the other group of second inner electrodes and first inner electrodes.

Preferably, the first and second conductive vias are disposed so that magnetic fields induced by current flowing into the inner electrodes connected thereto are offset, thus reducing ESL.

In a preferable embodiment for ESL reduction, each group of second conductive vias adjacent to a predetermined first conductive via is disposed to be spaced from the predetermined first conductive via by an equal interval.

Further, the first conductive via is provided in a plural number, in which the first and second conductive vias are disposed in corners of a regular square, respectively, for reduction of ESL. Particularly, in the present embodiment, the first conductive vias are disposed at two corners facing each other in a diagonal direction among the corners, and the second conductive vias are disposed at the other two corners.

According to the embodiment, the second inner electrode connected to one group of the second conductive vias is disconnected and electrically insulated from the other group of the second conductive vias so that the two groups of the second inner electrode(s) are not connected to same group of the second conductive via(s). In contrast, the MLCC includes at least one second conductive via connected to the two groups of the second inner electrode(s).

Furthermore, each group of second inner electrodes has an equal number so that each capacitor has the same electrostatic capacity. In contrast, at least one group of second inner electrodes has a number different from the other group of second inner electrodes, whereby at least one capacitor has a different electrostatic capacity. Similarly, at least one group of second conductive vias has a number different from the other group of second conductive vias.

The present invention also provides a wiring connection structure of a multilayered chip capacitor array, comprising: a baseboard having at least two power lines and a ground line; and a multilayered chip capacitor array package mounted on the baseboard, and having a wiring substrate having a microprocessor unit (MPU) chip and a multilayered chip capacitor array mounted on an underside of the wiring substrate, wherein the multilayered chip capacitor array includes: a capacitor body having a plurality of dielectric layers stacked together; a plurality of pairs of first and second inner electrodes which are formed on the plurality of dielectric layers such that one electrode of one pair of inner electrodes faces the other electrode of the one pair of inner electrodes with one of the plurality of dielectric layers interposed therebetween; at least one first outer terminal and a plurality of second outer terminals formed on at least one surface of a top surface and a bottom surface of the capacitor body; and at least one first conductive via and a plurality of second conductive vias formed in a stacking direction of the capacitor body and connected to the first outer terminal and the second outer terminal, respectively, wherein the at least one first conductive via is connected to the first inner electrode and is electrically insulated from the second inner electrodes, wherein the plurality of the second conductive vias are divided into k (k≧2) groups each having at least one second conductive via, and the second inner electrodes are divided into k groups each having at least one second inner electrode, and each group of second conductive vias are connected to each group of second inner electrodes and are electrically insulated from the other group of second inner electrodes and first inner electrodes, wherein the ground line is connected to the first external terminal, and the power lines are connected respectively to the second external terminals each connected to each of the k groups of second conductive vias, and wherein at least one of the power lines and the ground line is connected to the MPU chip by corresponding one of the first and second conductive vias of the multilayered chip capacitor.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
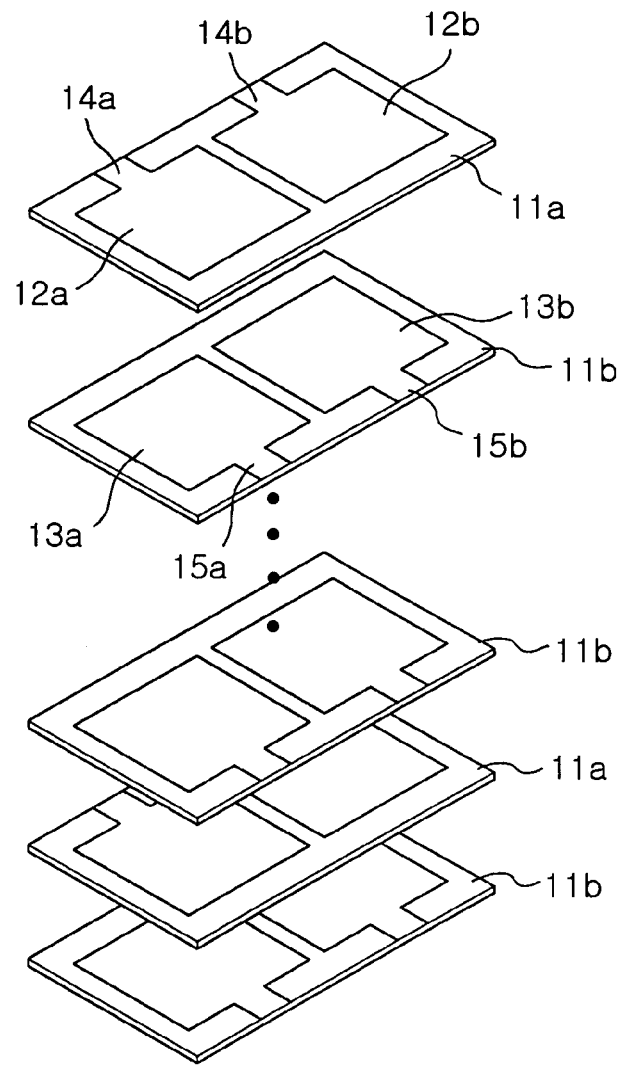
FIGS. 1a and 1b are an exploded perspective view and a schematic perspective view, respectively, of a conventional multilayered chip capacitor array.
Figure 1:
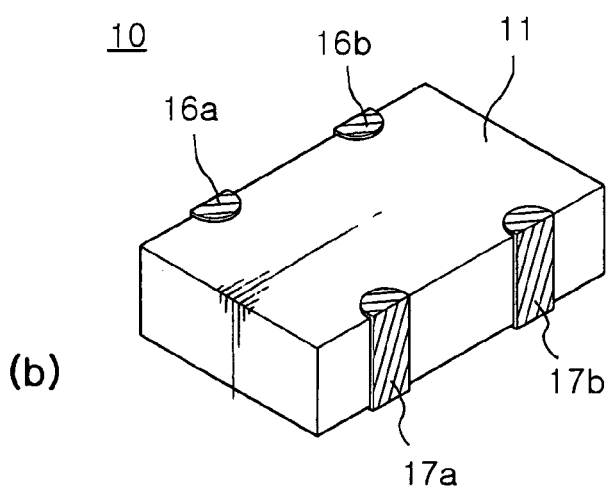

Hereinafter, a detailed description will be given of a multilayered chip capacitor array of the present invention, with reference to the accompanying drawings.

FIGS. 2a and 2b are a schematic perspective view and a side sectional view, respectively, of a multilayered chip capacitor array according to a first embodiment of the present invention. The multilayered chip capacitor array, according to the first embodiment, includes two capacitors.

As shown in FIG. 2a, a multilayered chip capacitor array 20 comprises a capacitor body 21 on which first outer terminals 27 and two groups of second outer terminals 26a and 26b are formed. The first outer terminal 27 is connected to a cathode and is connected to both of the capacitors. One group of the second outer terminal 26a is provided as an anode terminal of a capacitor, and the other group of the second outer terminal 26b is provided as an anode terminal of the other capacitor. In FIG. 2a, a top surface of the capacitor body is shown. A bottom surface thereof may be formed with outer terminals 26a, 26b and 27, corresponding to the outer terminals of the top surface thereof.

Figure 2:
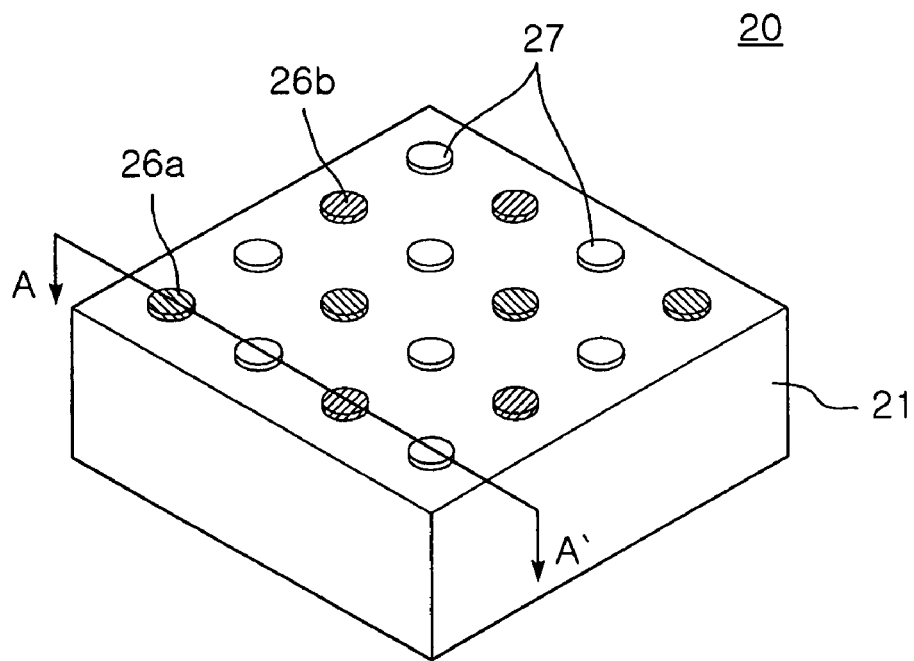
FIGS. 2a and 2b are a schematic perspective view and a side sectional view, respectively, of a multilayered chip capacitor array according to a first embodiment of the present invention.
Figure 2:
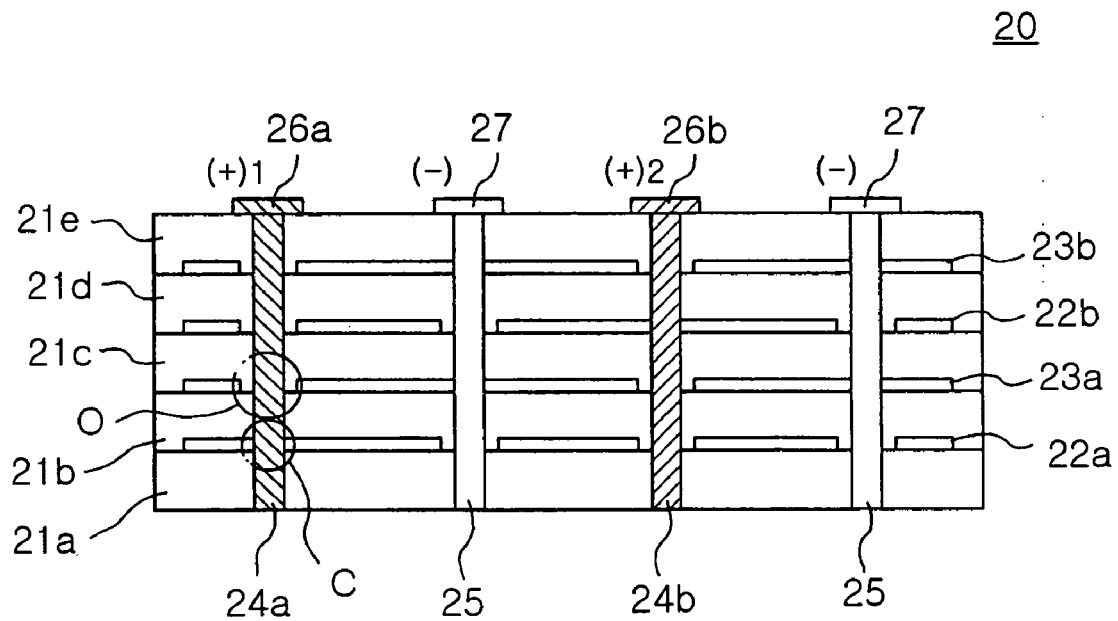

According to the first embodiment, the connection between the first and second outer terminals 27, 26a and 26b and inner electrodes 22a, 22b, 23a and 23b is realized by vertical conductive vias 25, 24a and 24b as seen in FIG. 2.

FIG. 2b is a sectional view taken along the line A–A' in the multilayered chip capacitor array 20 of FIG. 2a.

As shown in FIG. 2b, the capacitor body 21 of the multilayered chip capacitor array 20 includes a plurality of dielectric layers 21a–21e which are stacked together. The first inner electrodes 23a and 23b and the second inner electrodes 22a and 22b are alternately positioned such that the dielectric layers 21b–21d interpose between the first and second inner electrodes 22a, 23a, 22b and 23b, respectively.

The first conductive via 25 is connected to the two first inner electrodes 23a and 23b, whereby the first outer terminal 27 is electrically connected with the first inner electrodes 23a and 23b. However, the first conductive via 25 is electrically insulated from the two second inner electrodes 22a and 22b by an open region.

One second conductive via 24a is connected to one second inner electrode 22a, as shown in C of the drawing, thus electrically connecting the second inner electrode 22a with the second outer terminal 26a. Further, the second conductive via 24a is electrically insulated from the first inner electrodes 23a and 23b and the other second inner electrode 22b by the open region, as shown in O of the drawing. In this way, the other second conductive via 24b is connected to the other second inner electrode 22b, so that the second inner electrode 22b is electrically connected with the second outer terminal 26b. Further, the above second conductive via 24b is electrically insulated from the first inner electrodes 23a and 23b and the other second inner electrode 22a by the open region.

FIG. 2b illustrates the connection structure of the foremost row of the outer terminals in the A–A' direction and the inner electrodes, through the conductive vias connected to the above outer terminals. In this way, the other rows of the outer terminals have the connection structure with the inner electrodes using the conductive vias.

That is, while the first outer terminal 27 is connected to the first inner electrodes 23a and 23b through the first conductive vias 25 as shown in FIG. 2b, it is electrically disconnected from the second inner electrodes 22a and 22b. The second outer terminal 26a related to first positive polarity and the second outer terminal 26b related to second positive polarity are formed so as to be electrically connected only to the lowermost second inner electrode 22a and the other second inner electrode 22b, respectively.

Figure 3:
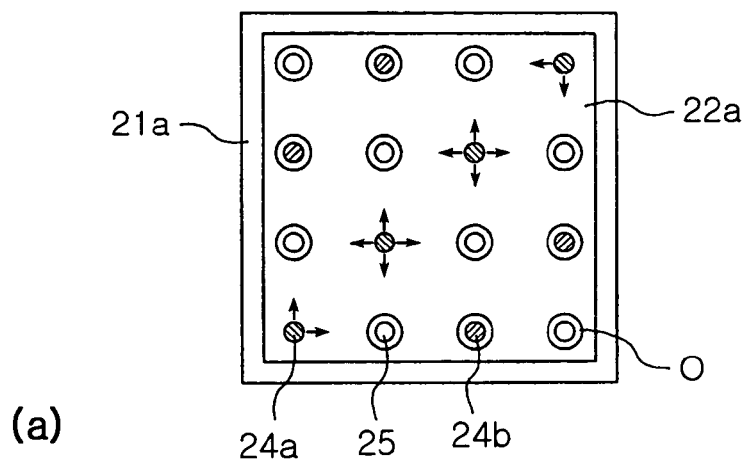
FIGS. 3a to 3c are views showing arrangements of conductive vias and inner electrodes of each dielectric layer applied to the multilayered chip capacitor array of FIG. 2b.
Figure 3:
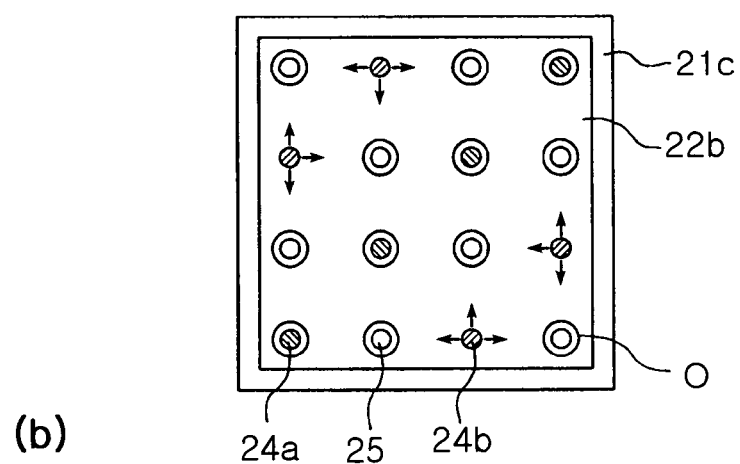
Figure 3:
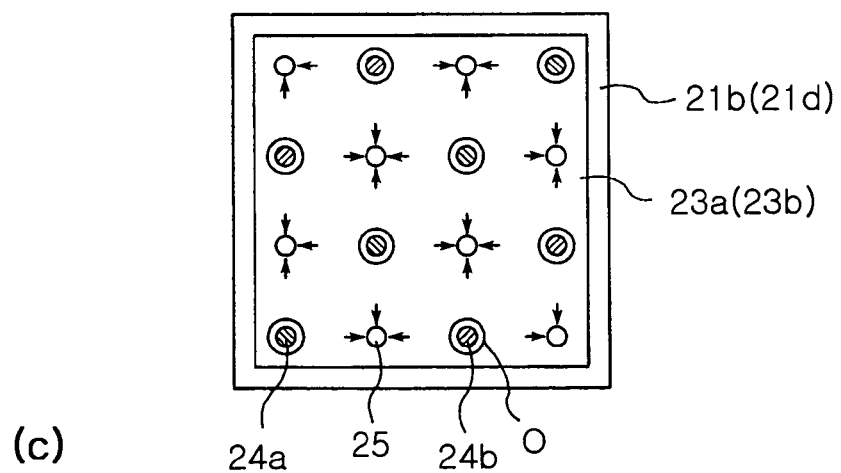

The connection structure shown in FIG. 2b is particularly specified with reference to FIGS. 3a to 3c.

FIGS. 3a to 3c show the arrangement of the conductive vias 24a, 24b and 25 and the inner electrodes 22a, 22b, 23a and 23b of the dielectric layers 21a, 21b, 21c and 21d applied to the multilayered chip capacitor array 20 of FIG. 2b.

FIG. 3a shows the second inner electrode 22a formed on the first dielectric layer 21a of FIG. 2b. As shown in the drawing, the second inner electrode 22a is connected only with the second conductive vias 4a related to the first positive polarity, and is electrically disconnected from the first conductive vias 25 and the other second conductive vias 24b by the open region.

As in FIG. 3b, the second inner electrode 22b formed on the third dielectric layer 21c is connected only with the second conductive vias 24b related to the second positive polarity, and is electrically disconnected from the first conductive vias 25 and the other second conductive vias 24a by the open region.

Further, the first inner electrodes 23a and 23b formed on the second dielectric layer 21b and the fourth dielectric layer 21d, respectively, are connected with the first conductive vias 25 related to the negative polarity, and are electrically disconnected from all the second conductive vias 24a and 24b, as illustrated in FIG. 3c.

The arrangement according to the first embodiment is favorable because magnetic fields induced by the current flowing into the inner electrodes are offset. That is, as shown in FIG. 3a or 3b, the first and second conductive vias 25, 24a and 24b are disposed at corners of a regular square, respectively. Also, the first conductive vias 25 are disposed at two corners facing each other in a diagonal direction among four corners, and the other group of second conductive vias 24a and 24b (related to the first positive polarity and the second positive polarity) are disposed at the other two corners. In this way, the first and second conductive vias 25, 24a and 24b related to the opposite polarities are regularly arranged to be adjacent, whereby the current direction may be reverse at the corresponding first and second inner electrodes 22a, 23a, 22b and 23b as shown in the arrows. Therefore, effective offset of the generated magnetic field results in remarkably reduced ESL.

Figure 4:
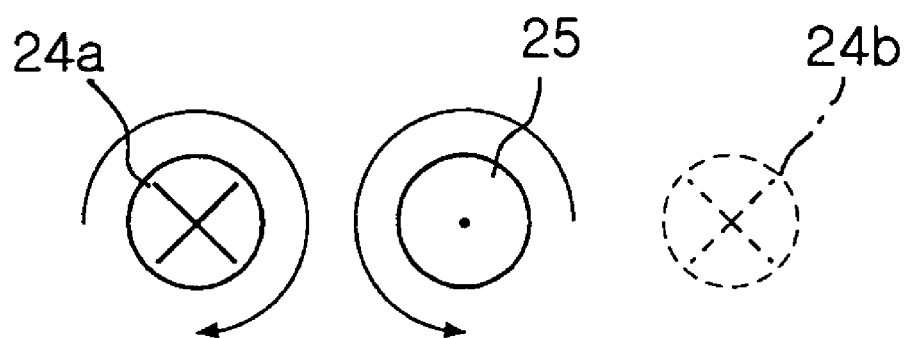
FIGS. 4a and 4b are schematic views showing ESL reduction effects in the multilayered chip capacitor array, according to the present invention.
Figure 4:
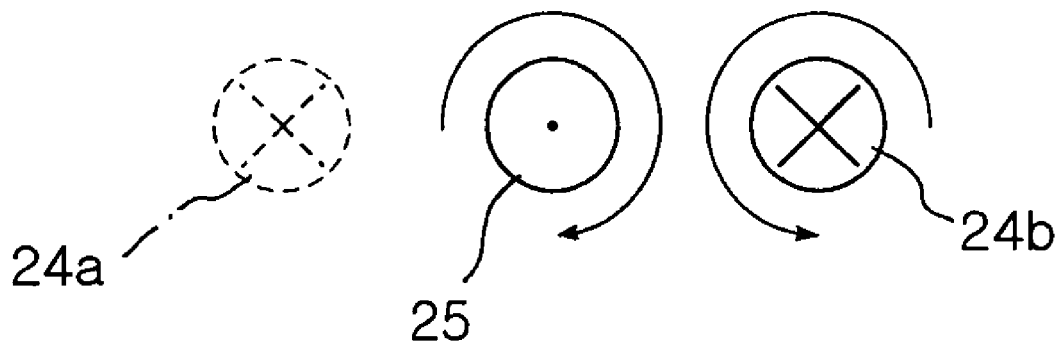

FIGS. 4a and 4b are schematic views showing the ESL reduction effects in the multilayered chip capacitor array of the present invention.

In the multilayered chip capacitor array shown in FIG. 2b, when voltage is applied to the first outer terminal 27 and the second outer terminal 26a related to the first positive polarity, the second conductive via 24a connected to the second outer terminal 26a and the first conductive via 25 adjacent to the above via hole 24a generate opposite magnetic fluxes which can be offset, as in FIG. 4a.

Further, when voltage is applied to the first outer terminal 27 and the second outer terminal 26b related to the second positive polarity, the second conductive via 24b connected to the second outer terminal 26b and the first conductive via 25 adjacent to the above via hole 24b generate opposite magnetic fluxes able to be offset, as depicted in FIG. 4b.

Hence, in the vertical connection structure through the conductive vias 24a, 24b and 25 according to the present invention, the magnetic field decreases between the neighboring conductive vias having the opposite polarities, thus drastically reducing ESL.

Each group of second conductive vias adjacent to a predetermined first conductive via may be disposed to be spaced from the predetermined first conductive via by an equal interval. Likewise, the arrangement of the conductive vias may be changed to easily connect the outer terminal and the outer circuit, which is illustrated in FIGS. 5a to 5c.

Figure 5:
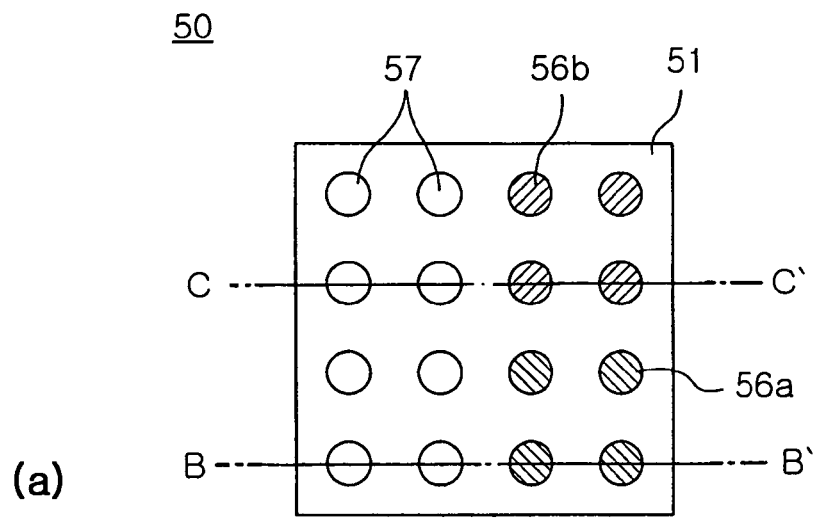
FIGS. 5a to 5c are a top plan view and sectional views of a multilayered chip capacitor array according to a second embodiment of the present invention.
Figure 5:
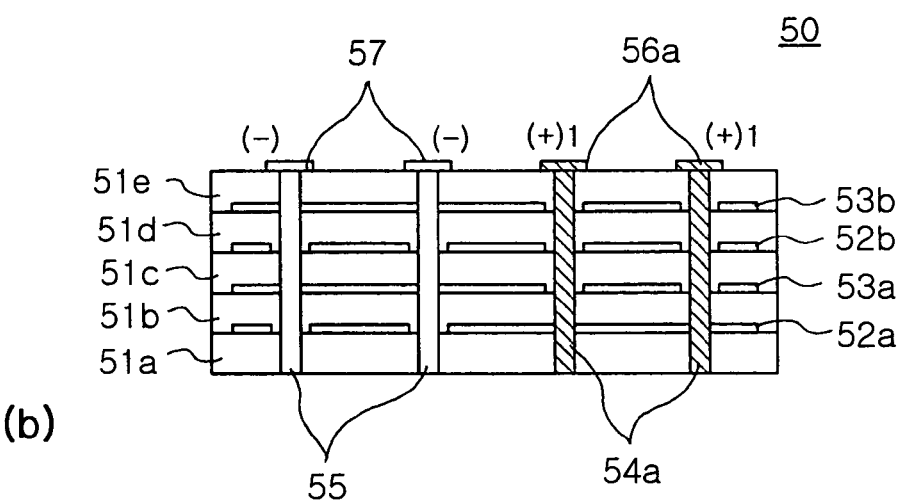
Figure 5:
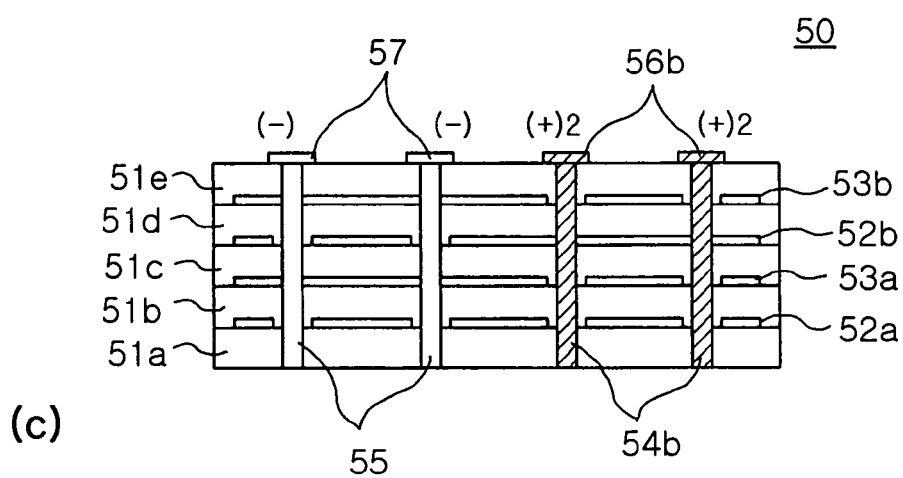

FIGS. 5a to 5c are a top plan view and sectional views showing a multilayered chip capacitor array 50 according to a second embodiment of the present invention.

As shown in FIG. 5a, a top surface of a capacitor body 51 is formed with first outer terminals 57 related to negative polarity, second outer terminals 56a related to first positive polarity, and second outer terminals 56b related to second positive polarity. As such, eight first outer terminals 57 are arranged in two rows of one side on the top surface of the capacitor body 51, and the second outer terminals 56a and 56b are divided into groups and four each thereof are arranged in a regular square form in the other two rows.

FIG. 5b is a sectional view taken along the line B–B' of FIG. 5a. As shown in FIG. 5b, first conductive vias 55 connected with the first outer terminals 57, and second conductive vias 54a connected with the second outer terminals 56a related to the first positive polarity are connected to first and second inner electrodes 52a, 53a and 53b.

The first conductive via 55 is connected to the two first inner electrodes 53a and 53b to electrically connect the first outer terminal 57 and the first inner electrodes 53a and 53b, and is electrically insulated from the two second inner electrodes 52a and 52b by the open region. Further, the second conductive via 54a is connected to one second inner electrode 52a to electrically connect the second inner electrode 52a to the second outer terminal 56, and is electrically insulated from the first inner electrode 53 and the other second inner electrode 52b by the open region.

FIG. 5c is a sectional view taken along the line C–C' of FIG. 5a. As shown in FIG. 5c, the first conductive vias 55 connected with the first outer terminals 57, and second conductive vias 54b connected with the second outer terminals 56b having the second positive polarity are connected to the first and second inner electrodes 52b, 53a and 53b.

The first conductive vias 55 are connected to the two first inner electrodes 53a and 53b in the same manner as in FIG. 5b, to electrically connect the first outer terminal 57 with the first inner electrodes 53a and 53b, and is electrically insulated from the two second inner electrodes 52a and 52b by the open region. Further, the second conductive vias 54b are connected to one second inner electrode 52b to electrically connect the second inner electrode 52b with the second outer terminal 56b, and are electrically insulated from the first inner electrodes 53a and 53b and the other second inner electrode 52a by the open region.

The multilayered chip capacitor array according to the second embodiment is disadvantageous because ESL reduction effects are expected only in the two neighboring central rows having opposite polarities among the first outer terminals 57 and the second outer terminals 56a and 56b, but is advantageous because a mounting process can be easily performed by a simple terminal arrangement.

As such, the first and second conductive vias are provided in plural numbers which are equal. This case is exemplified for convenience of description. Alternatively, since the first conductive vias have a common polarity, only one need be used.

Although the multilayered chip capacitor array having two capacitors is illustrated, it may have three or more capacitors. In this case, such a multilayered chip capacitor array is manufactured by realizing the above connection structure using a plurality of the second conductive vias and a plurality of the second inner electrodes divided into groups equal to the number of capacitors.

Figure 6:
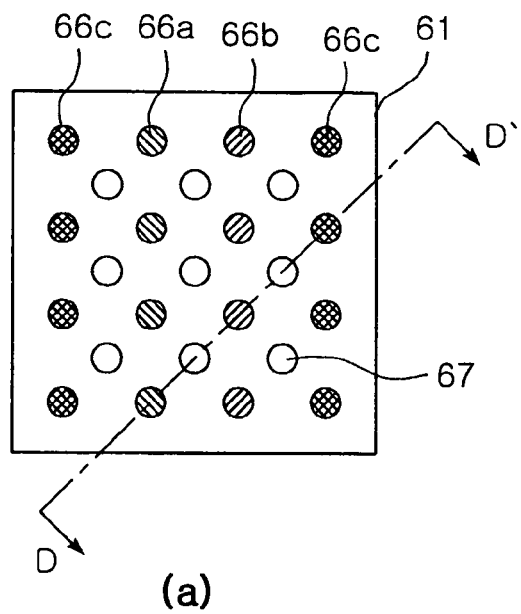
FIGS. 6a and 6b are a top plan view and a sectional view, respectively, of a multilayered chip capacitor array according to a third embodiment of the present invention.
Figure 6:
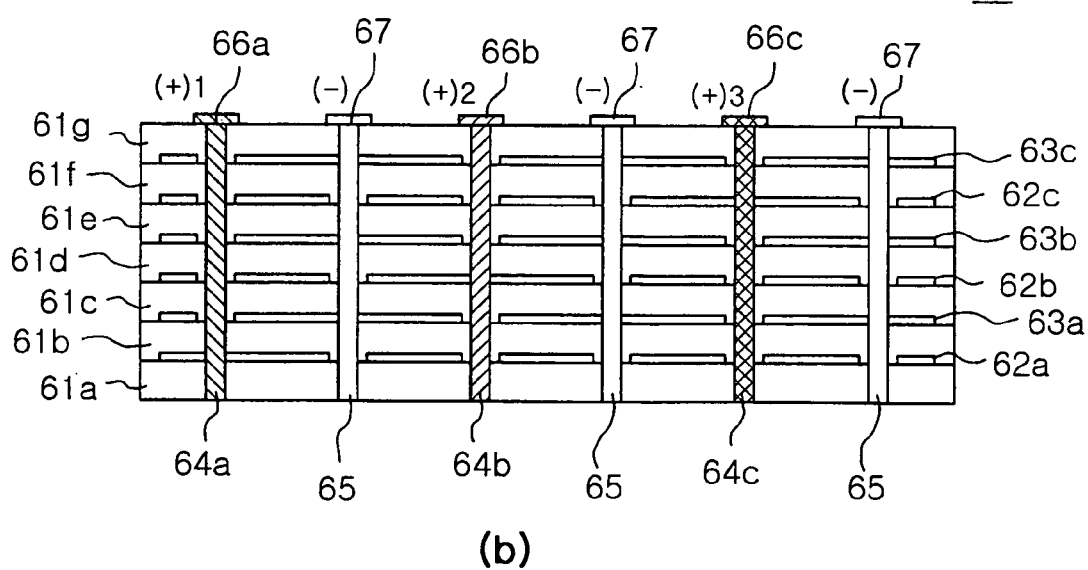

FIGS. 6a and 6b are a top plan view and a sectional view, respectively, showing a multilayered chip capacitor array 60 having three capacitors according to a third embodiment of the present invention. The multilayered chip capacitor array 60 includes three capacitors having a connection structure separately formed only for positive polarity while having a common negative polarity.

In FIG. 6a, a top surface (or bottom surface) of a capacitor body 61 is formed with first outer terminals 67 related to negative polarity and second outer terminals 66a, 66b and 66c related to positive polarity. The second outer terminal related to positive polarity is divided into second outer terminals 66a, 66b and 66c related to first to third positive polarity.

As for the outer terminal arrangement according to the third embodiment, the outer terminals of the positive polarity are positioned at corners of a regular square and the outer terminals of the negative polarity are positioned at a central portion of the square.

FIG. 6b is a sectional view taken along the line D–D' of IG. 6a. In FIG. 6b, there is illustrated a connection structure of first conductive vias 65 connected with the first outer terminals 67, and second conductive vias 64a, 64b and 64c connected with second outer terminals 66a, 66b and 66c related to the first to third positive polarity.

The first conductive vias 65 are connected to the three first inner electrodes 63a, 63b and 63c, to electrically connect the first outer terminal 67 and the first inner electrodes 63a, 63b and 63c, and are electrically insulated from the three second inner electrodes 62a, 62b and 62c by the open region.

Further, each of the second conductive vias 64a, 64b and 64c related to the first to third polarity are connected to one second inner electrode 62a, 62b or 62c, and is electrically insulated from the first inner electrodes 63a, 63b and 63c and the other two second inner electrodes 62b and 62c; 62a and 62c or 62a and 62b by the open region.

According to the third embodiment, the second conductive via 64c related to the third positive polarity may be more than the second conductive vias 64a and 64b related to the other positive polarity. The second conductive via 64c related to the third positive polarity is connected to the second inner electrode 62c equal to the number of the inner electrode 62a or 62b connected to the other second conductive via 64a or 64b, and also, is simultaneously connected to both sides separated from each other by a wide interval.

Similarly, one group of second inner electrodes connected to the second conductive vias related to positive polarity may have a different number from the other group of inner electrodes, to exhibit a different electrostatic capacity.

Further, although the second inner electrodes are provided in the state of not overlapping to correspond to the group of second conductive vias in the present embodiment, at least one of the second inner electrodes may be connected to the other group of second conductive vias related to positive polarity to realize various capacitor array structures.

In the above embodiments, the first and second outer terminals are provided to correspond to the number of the first and second conductive vias, respectively.

Alternatively, the same group of outer terminals having the same polarity may be mutually connected, and thus, be partially integrated. For example, in FIG. 3a, a conductive material may be additionally printed in a diagonal direction, and thus, the same group of outer terminals having the same polarity may be mutually connected. In FIG. 6a, the conductive material may be additionally printed in a column direction, whereby the outer terminals may be connected according to groups.

The MLCCs according to the above embodiments are shown and described as a regular square form (see FIG. 2, FIGS. 3a–3c, FIG. 5a and FIG. 6a). However, the MLCC may include other shape, such as a rectangle. For rectangle shaped MLCC, the number of the connective vias on column may be different from the number of the connective vias on row. In this case, it can be understood that the above regular square form is a portion of a rectangle shaped MLCC.

The multilayered chip capacitor array of the invention is required to have a new wiring connection structure so that it can be applied as a decoupling capacitor in practice.

For example, the multilayered chip capacitor array as shown in FIGS. 2a and 2b needs a wiring connection structure adequate for the first outer terminals 27 related with negative polarity and the second outer terminals 26a and 26b related with first and second positive polarities.

Preferably, the wiring connection structure allows a wiring path to be shortened with the first and/or second conductive vias formed through the multilayered chip capacitor array, thereby minimizing parasitic inductance.

Figure 7:
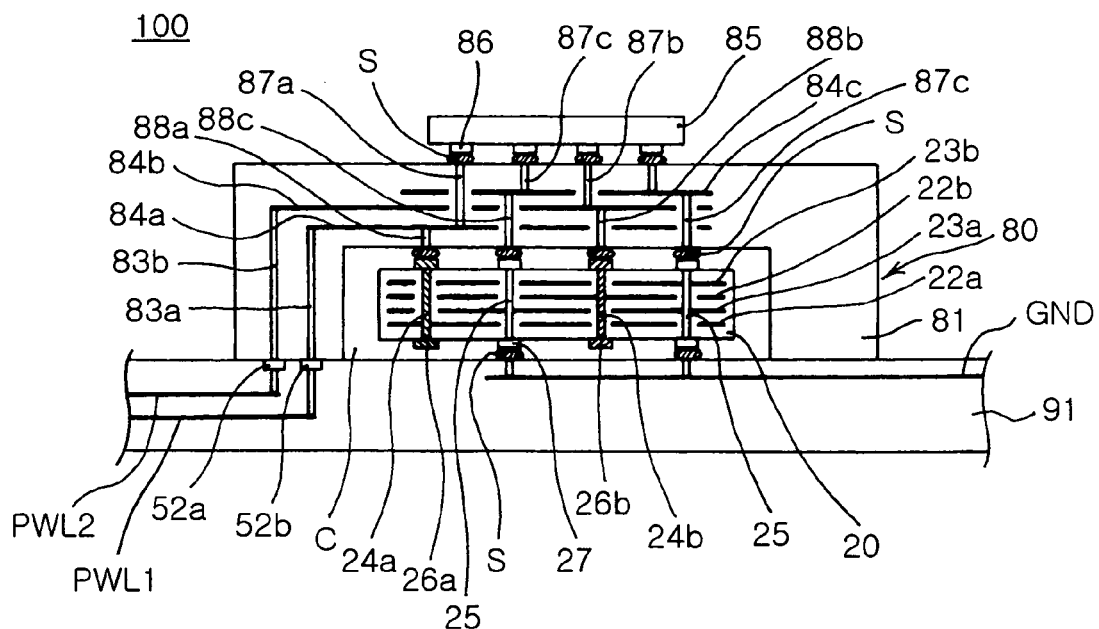
FIG. 7 illustrates an embodiment of a wiring connection structure of a multilayered chip capacitor array of the invention.
Figure 8:
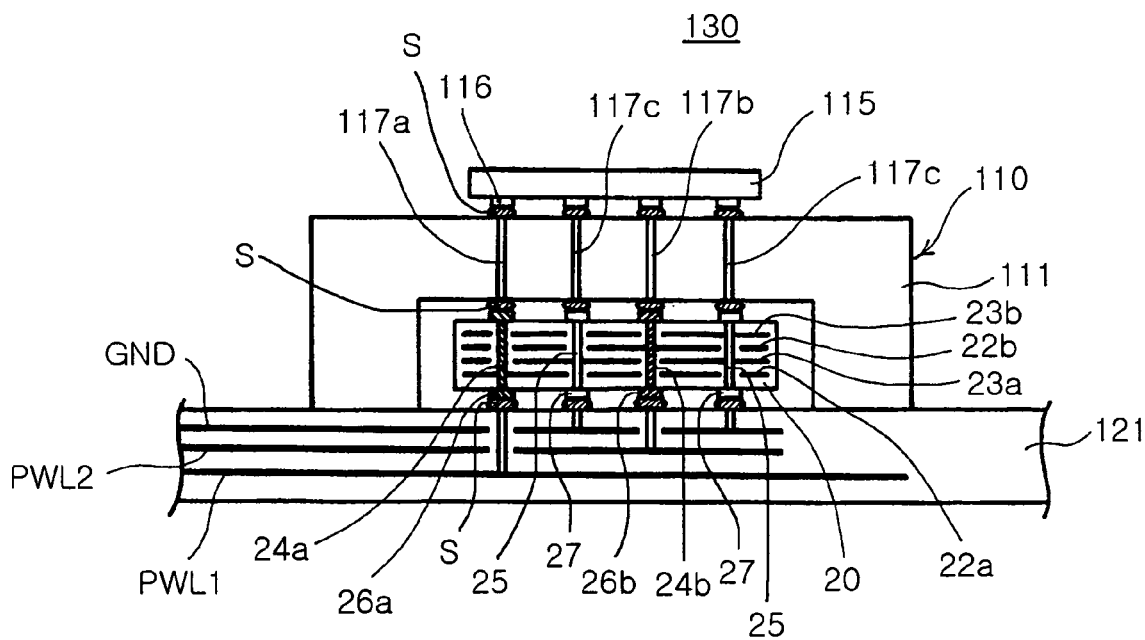
FIG. 8 illustrates another embodiment of the wiring connection structure of a multilayered chip capacitor array of the invention.

FIGS. 7 and 8 illustrate different embodiments of such a wiring connection structure. The multilayered chip capacitor array adopted herein may be understood as the multilayered chip capacitor as illustrated with reference to FIGS. 2A and 2B, but not limited thereto.

Referring to FIG. 7 first, the wiring connection structure 100 of the multilayered chip capacitor includes a baseboard 91 such as a PC board and a multilayered chip capacitor array package 80.

The multilayered chip capacitor array package 80 includes a wiring substrate 81 having internal circuit elements 83a, 83b, 84a, 84b, 84c, 87a, 87b, 87c, 88a, 88b and 88c and a microprocessor unit (MPU) 85 mounted on the top of the wiring substrate 81. The wiring substrate 81 also has a cavity area C formed in a lower part thereof, which provides a space for mounting a multilayered chip capacitor array 20 therein.

First and second power lines PWL1 and PWL2 and a ground line GND are installed in the baseboard 91. The ground line GND is provided through the baseboard 91, and connected to a second external terminal 27 placed on the underside of the multilayered chip capacitor array 20 by connector means such as soldering S. The ground line GND is also connected to first external terminals 27 placed on the top of the multilayered chip capacitor array 20 by conductive vias 25 of the multilayered chip capacitor array 20, and to chip terminals 86 of the MPU 85 through the internal circuit elements 84c, 87c and 88c of the wiring substrate 81.

The first and second power lines PWL1 and PWL2 are connected to the terminals 86 of the MPU chip 85 and the terminals 26a and 26b of the multilayered chip capacitor 20 through the internal circuit elements 83a, 83b, 84a, 84b, 87a, 87b, 88a and 88b, and the MPU chip 85 is connected to the multilayered chip capacitor 20 through the internal circuit elements 84a, 84b, 87a, 87b, 88a and 88b.

In this way, the connection path of the multilayered chip capacitor array 20 and the MPU chip 85 with the ground line GND can be shortened when the MPU chip 85 is connected to the baseboard 91 by the first conductive vias 25. This can simplify a fabrication process of the wiring substrate 81 as well as reduce parasitic inductance owing to the shortened connection path to the ground line GND.

While this embodiment as shown in FIG. 7 has been illustrated with the multilayered chip capacitor 20 having two capacitor parts, in which the external terminals are provided into two groups 26a and 26b, the wiring connection structure 100 of the invention can be applied likewise to a multilayered chip capacitor array having three or more capacitor parts. More specifically, a suitable wiring connection structure can be realized by additionally installing power lines of the baseboard 91 according to the number of capacitor parts (the number of external terminal groups) and utilizing the connection structure as illustrated with reference to FIG. 7.

As described above, by connecting the MPU chip to a plurality of power lines by the multilayered chip capacitor array, it is possible to properly select the capacity of a capacitor according to adjustable current.

While this embodiment has been illustrated with an arrangement in which merely the ground line GND is connected by the first conductive vias 25, at least one of the first and second power lines PWL 1 and PWL2 can be additionally or selectively connected to the MPU chip 85 by the second conductive vias 24a and 24b.

Furthermore, all of the first and second power lines PWL1 and PWL 2 and the ground line GND can be connected by the first and second conductive vias 25; 24a and 24b of the multilayered chip capacitor array 20 so as to further omit the circuit elements 83a and 83b of the wiring substrate 81 related with the first and second power lines PWL1 and PWL2.

Referring to FIG. 8, a wiring connection structure 130 of a multilayered chip capacitor array includes a baseboard 121 such as a PC board and a multilayered chip package capacitor array 110. The multilayered chip capacitor array package 110 includes a wiring substrate 111 having vertical connection elements 117a, 117b and 117c such as conductive vias and a microprocessor unit (MPU) 115 mounted on the top of the wiring substrate 111. A cavity area C is provided in a lower part of the wiring substrate 111, which provides a space for mounting the multilayered chip capacity array 20 therein.

First and second power lines PWL1 and PWL2 and a ground line GND are installed in the baseboard 121. All of the first and second power lines PWL1 and PWL2 and the ground line GND provided through the baseboard 412 are connected to external terminals 26a, 26b; 27 on the underside of the multilayered chip capacitor array 20 by connector means S such as soldering. More specifically, the ground line GND is connected to the first external terminals related with negative polarity, the first power line PWL1 is connected to one of the second external terminals 26a related with first positive polarity, and the second power line PWL2 is connected to the other one of the second external terminals 26b related with second positive polarity.

As a result, all of the lines PWL1 and PWL2 and the line GND of the baseboard are connected to the first and second external terminals 27; 26a and 26b on the top of the multilayered chip capacitor array 20 by the first and second conductive vias 25; 24a and 24b of the multilayered chip capacitor array 20. The external terminals 27; 26a and 26b on the top are also connected to terminals 116 of the MPU chip 115 through vertical connection elements 117a, 117b and 117c of the wiring substrate 31.

As described above, the first and second conductive vias 24a and 24b; 25 of the multilayered chip capacitor array 20 can shorten the connection path between the MPU chip 115 and the baseboard 121, thereby simplifying fabrication process. The reduced connection path can also reduce parasitic inductance.

Furthermore, the first and second external terminals 27; 26a and 26b of the multilayered chip capacitor array of this embodiment have an arrangement and a spacing substantially the same as those of the terminals 116 of the MPU chip 115, such that internal (circuit) elements of the wiring substrate can be formed only of the vertical connection elements 117a, 117b and 117c such as conductive vias. As a result, internal paths of the wiring substrate 111 can be additionally simplified or shortened, thereby more effectively reducing parasitic inductance.

As described above, the present invention provides a multilayered chip capacitor array, characterized in that a plurality of capacitors are not horizontally arranged, but vertically connected through conductive vias, thus effectively reducing the ESL through the arrangement of conductive vias. Furthermore, the wiring connection structure of the invention allows direct connection of at least one of power lines and a ground line to an MPU chip by conductive vias of the multilayered chip capacitor array, thereby selectively adjusting the capacity of a decoupling capacitor according to adjustable current supply. This can also further simplify wiring connection, thereby effectively reducing parasitic inductance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multilayered chip capacitor array, comprising:
   a capacitor body having a plurality of dielectric layers stacked together;
   a plurality of pairs of first and second inner electrodes which are formed on the plurality of dielectric layers such that one electrode of one pair of inner electrodes faces the other electrode of the one pair of inner electrodes with one of the plurality of dielectric layers interposed therebetween;
   at least one first outer terminal and a plurality of second outer terminals formed on at least one surface of a top surface and a bottom surface of the capacitor body; and
   at least one first conductive via and a plurality of second conductive vias formed in a stacking direction of the capacitor body and connected to the first outer terminal and the second outer terminal, respectively,
   wherein the at least one first conductive via is connected to the first inner electrodes and is electrically insulated from the second inner electrodes,
   wherein the plurality of the second conductive vias are divided into k (k≧2) groups each having at least one second conductive via, and the second inner electrodes are divided into k groups each having at least one second inner electrode, and each group of second conductive vias is connected to each group of second inner electrodes and is electrically insulated from the other group of second inner electrodes and first inner electrodes, wherein the first and second conductive vias are disposed so that magnetic fields induced by current flowing into the inner electrodes connected thereto are offset.

2. The multilayered chip capacitor array as set forth in claim 1, wherein each group of second conductive vias adjacent to a predetermined first conductive via is disposed to be spaced from the predetermined first conductive via by an equal interval.

3. The multilayered chip capacitor array as set forth in claim 1, wherein the first conductive via is provided in a plural number.

4. The multilayered chip capacitor array as set forth in claim 3, wherein the first and second conductive vias are disposed at corners of a square, respectively.

5. The multilayered chip capacitor array as set forth in claim 4, wherein the first conductive vias are disposed at two corners facing each other in a diagonal direction among the corners, and the other group of the second conductive vias is disposed at the other two corners.

6. The multilayered chip capacitor array as set forth in claim 1, wherein at least one group of second conductive vias has a different number from the other group of second conductive vias.

7. The multilayered chip capacitor array as set forth in claim 1, wherein each group of second inner electrodes is connected different second conductive via holes, respectively.

8. The multilayered chip capacitor array as set forth in claim 1, wherein each group of second inner electrodes includes at least one inner electrode connected to same second conductive hole(s).

9. The multilayered chip capacitor array as set forth in claim 1, wherein each group of second inner electrodes has an equal number.

10. The multilayered chip capacitor array as set forth in claim 1, wherein at least one group of second inner electrodes has a different number from the other group of second inner electrodes.

11. A wiring connection structure of a multilayered chip capacitor array, comprising:
a baseboard having at least two power lines and a ground line; and
a multilayered chip capacitor array package mounted on the baseboard, and having a wiring substrate having a microprocessor unit (MPU) chip and a multilayered chip capacitor array mounted on an underside of the wiring substrate,
wherein the multilayered chip capacitor array includes:
a capacitor body having a plurality of dielectric layers stacked together;
a plurality of pairs of first and second inner electrodes which are formed on the plurality of dielectric layers such that one electrode of one pair of inner electrodes faces the other electrode of the one pair of inner electrodes with one of the plurality of dielectric layers interposed therebetween;
at least one first outer terminal and a plurality of second outer terminals formed on at least one surface of a top surface and a bottom surface of the capacitor body; and
at least one first conductive via and a plurality of second conductive vias formed in a stacking direction of the capacitor body and connected to the first outer terminal and the second outer terminal, respectively,
wherein the at least one first conductive via is connected to the first inner electrodes and is electrically insulated from the second inner electrodes,
wherein the plurality of the second conductive vias are divided into k ($k \geq 2$) groups each having at least one second conductive via, and the second inner electrodes are divided into k groups each having at least one second inner electrode, and each group of second conductive vias are connected to each group of second inner electrodes and are electrically insulated from the other group of second inner electrodes and first inner electrodes,
wherein the first and second conductive vias are disposed so that magnetic fields induced by current flowing into the inner electrodes connected thereto are offset,
wherein the ground line is connected to the first external terminal, and the power lines are connected respectively to the second external terminals each connected to each of the k groups of second conductive vias, and
wherein at least one of the power lines and the ground line is connected to the MPU chip by corresponding one of the first and second conductive vias of the multilayered chip capacitor.

12. The wiring connection structure according to claim 11, wherein the first and second external terminals related with the first or second conductive via connecting at least one of the power lines and the ground line to the MPU chip are formed on both of top and bottom surfaces of the capacitor body.

13. The wiring connection structure according to claim 11, wherein the power lines of the wiring substrate are connected to the MPU chip by the k group of second conductive vias, respectively.

14. The wiring connection structure according to claim 13, wherein the ground line of the wiring substrate is connected to the MPU chip by the first conductive via.

15. The wiring connection structure according to claim 11, the first and second external terminals of the multilayered chip capacitor array have an arrangement and a spacing substantially the same as those of the MPU chip.

* * * * *